United States Patent
Ahn et al.

(10) Patent No.: US 11,029,256 B2
(45) Date of Patent: Jun. 8, 2021

(54) APPARATUS FOR MEASURING WAFER

(71) Applicant: Samsung Electronics Co., Ltd., Suwon-si (KR)

(72) Inventors: Tae-Heung Ahn, Seoul (KR); Racine Nassau, Gainesville, FL (US); Su Hwan Park, Incheon (KR); Ki Wan Seo, Seoul (KR); Nam Il Koo, Hwaseong-si (KR); In Keun Baek, Suwon-si (KR); Jong Min Yoon, Incheon (KR); Ik Seon Jeon, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/846,978

(22) Filed: Apr. 13, 2020

(65) Prior Publication Data
US 2021/0025832 A1    Jan. 28, 2021

(30) Foreign Application Priority Data
Jul. 22, 2019 (KR) .................. 10-2019-0088357

(51) Int. Cl.
*G01N 21/95* (2006.01)
(52) U.S. Cl.
CPC ................ *G01N 21/9501* (2013.01)
(58) Field of Classification Search
CPC ............. G01N 21/95; G01N 21/9501; G01N 21/9503; G01N 21/9505
USPC ...................................... 356/237.5
See application file for complete search history.

(56) References Cited

U.S. PATENT DOCUMENTS

| | | | |
|---|---|---|---|
| 6,603,531 B1* | 8/2003 | Binnard | G03B 27/42 355/53 |
| 8,197,636 B2 | 6/2012 | Shah et al. | |
| 9,929,105 B2 | 3/2018 | Nakamura | |
| 2004/0233412 A1* | 11/2004 | Ono | G03F 7/70716 355/72 |
| 2008/0163899 A1* | 7/2008 | Takiguchi | H01L 21/67051 134/30 |

(Continued)

FOREIGN PATENT DOCUMENTS

| KR | 20110055787 A | 5/2011 |
|---|---|---|
| KR | 20120105670 A | 9/2012 |

(Continued)

*Primary Examiner* — Roy M Punnoose
(74) *Attorney, Agent, or Firm* — Muir Patent Law, PLLC

(57) ABSTRACT

Provided is an apparatus for measuring a wafer. The apparatus may include a chuck disposed on a stage and a plate connected with the stage, a horizontal frame configured to support a wafer, and a vertical frame connecting the plate and the horizontal frame. The apparatus may further include first to third adsorption portions connected with the horizontal frame and configured to adsorb the wafer, a support bar penetrating through the chuck and extending in a first direction and a beam irradiator connected to the support bar and disposed between the plate and the horizontal frame. The beam irradiator may be configured to irradiate a beam on the wafer. The apparatus may further include a detector on an opposite side of the horizontal frame from the beam irradiator and configured to receive the beam after it has penetrated through the wafer.

20 Claims, 13 Drawing Sheets

(56) References Cited

U.S. PATENT DOCUMENTS

| | | | |
|---|---|---|---|
| 2014/0152976 A1* | 6/2014 | VanHoomissen | ........................... G01N 21/9505 356/51 |
| 2018/0284071 A1 | 10/2018 | Wright | |
| 2018/0364181 A1 | 12/2018 | Park et al. | |
| 2021/0057262 A1* | 2/2021 | Nassau | ............. H01L 21/68714 |

FOREIGN PATENT DOCUMENTS

| KR | 20130072535 A | 7/2013 |
|---|---|---|
| KR | 20160080580 A | 7/2016 |

* cited by examiner

FIG. 1
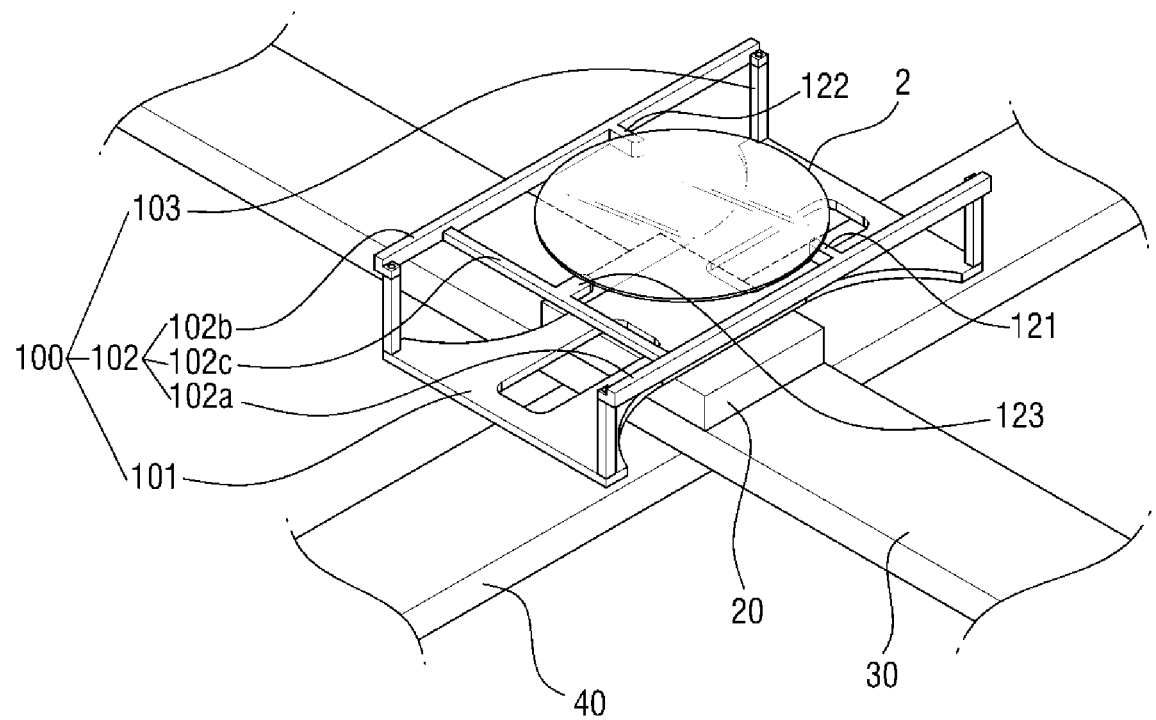
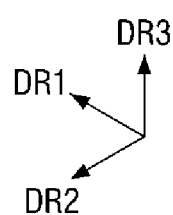

FIG. 3
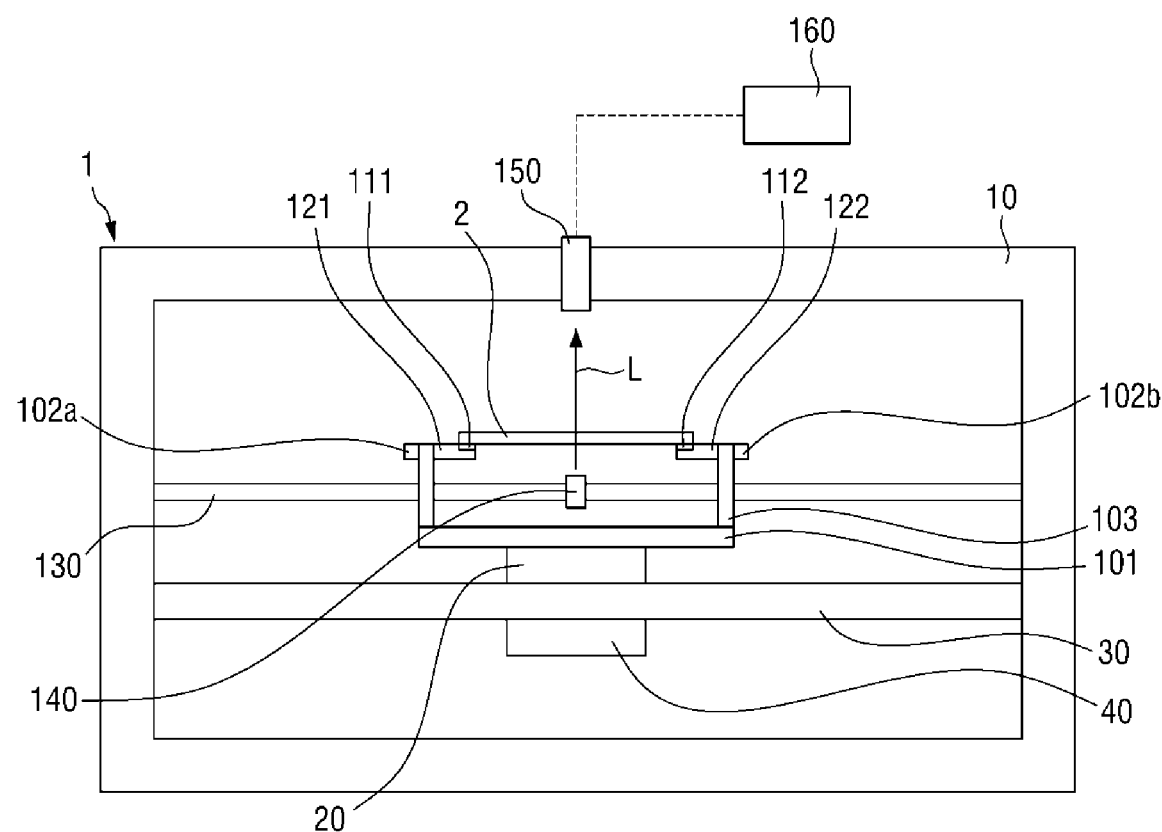
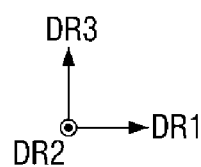

FIG. 4
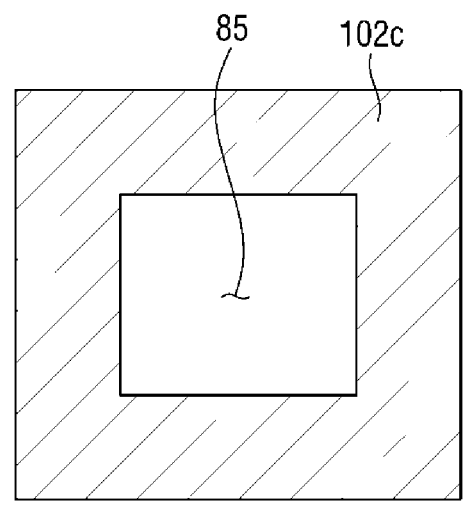
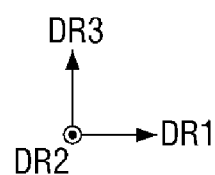

FIG. 6
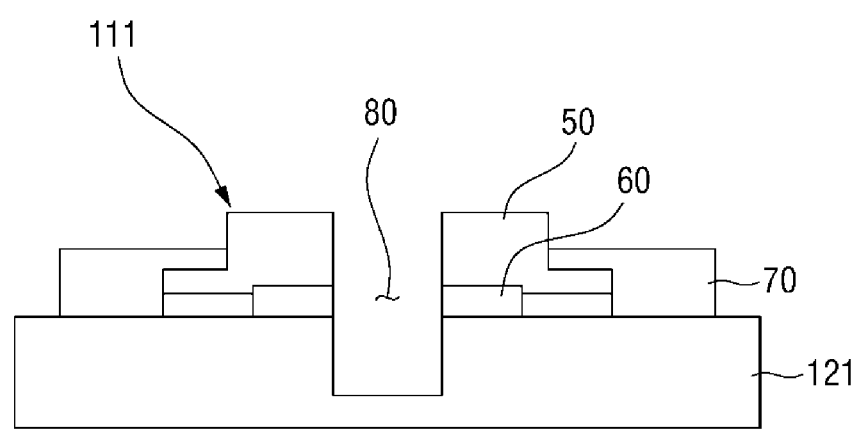
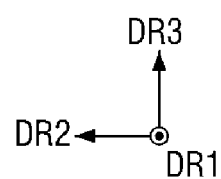

FIG. 8
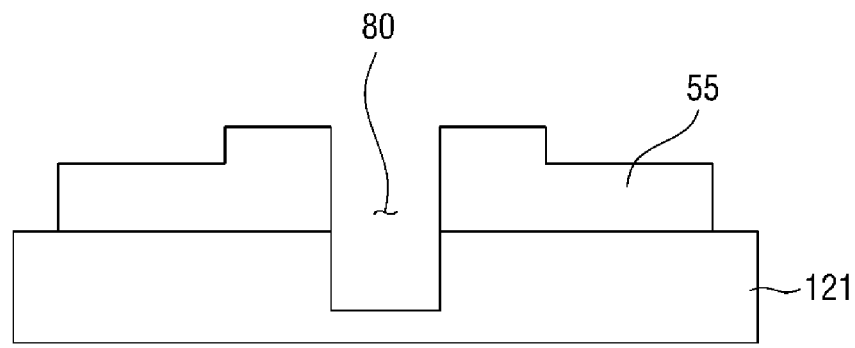
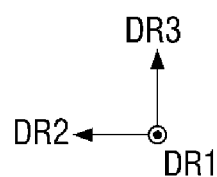

APPARATUS FOR MEASURING WAFER

This application claims the benefit of Korean Patent Application No. 10-2019-0088357, filed on Jul. 22, 2019, in the Korean Intellectual Property Office, the disclosure of which is incorporated herein in its entirety by reference.

BACKGROUND OF THE DISCLOSURE

1. Technical Field

The present disclosure relates to an apparatus for measuring a wafer.

2. Description of the Related Art

When a defect occurs in a surface or an inner portion of a semiconductor device, electrical characteristic of the semiconductor device may deteriorate. Recently, as high-density patterns of circuit configurations are more readily available with development of semiconductor integration technology, the importance of a precise examination method, which is nondestructive for blocking performance deterioration of a product due to minute defects of an inner portion as well as surface defects such as external materials, bending, scratches or the like, is increased.

For nondestructive examination methods, a method for examining electrical characteristic of the semiconductor device is used; however, there is a problem in which a defective portion may not be detected precisely regardless of whether the portion is defective or not defective due to the electrical performance deterioration being detected.

SUMMARY

A technical object of the present disclosure is to provide a wafer examination apparatus for examining a wafer which enhances reliability of a beam transmission method of a wafer measuring method by using a chuck minimizing interference of a beam, and a method for fabricating a semiconductor device in utilization of the wafer examination apparatus.

Another technical object of the present disclosure is to provide a wafer examination apparatus for enhancing reliability of a wafer measuring method by measuring a wafer in utilization of an inpainting method or wafer rotation, and a method for fabricating a semiconductor device in utilization of the wafer examination apparatus.

The objectives that are intended to be addressed by the present disclosure are not limited to those mentioned above, and other objectives that are not mentioned above may be clearly understood to those skilled in the art based on the description provided below.

According to an aspect of the present inventive concept, there is provided an apparatus for measuring a wafer. The apparatus may include a chuck disposed on a stage and a plate connected with the stage, a horizontal frame configured to support a wafer, and a vertical frame connecting the plate and the horizontal frame. The apparatus may further include first to third adsorption portions connected with the horizontal frame and configured to adsorb the wafer, a support bar penetrating through the chuck and extending in a first direction and a beam irradiator connected to the support bar and disposed between the plate and the horizontal frame. The beam irradiator may be configured to irradiate a beam on the wafer. The apparatus may further include a detector on an opposite side of the horizontal frame from the beam irradiator and configured to receive the beam after it has penetrated through the wafer.

According to an additional aspect of the present inventive concept, there is provided an apparatus for measuring a wafer. The apparatus may include a stage and a plate disposed on the stage, a horizontal frame comprising a first horizontal frame portion extending in a first direction, a second horizontal frame portion displaced from the first horizontal frame portion in a second direction orthogonal to the first direction and extending in the first direction, and a third horizontal frame portion connecting the first horizontal frame portion and the second horizontal frame portion. The horizontal frame may be configured to support a wafer. The apparatus may include a vertical frame connecting the plate and the horizontal frame, a first adsorption portion connected with the first horizontal frame portion and configured to adsorb the wafer, a second adsorption portion connected with the second horizontal frame portion and configured to adsorb the wafer, and a third adsorption portion connected with the third horizontal frame portion and configured to adsorb the wafer. The apparatus may further include a beam irradiator disposed between the plate and the horizontal frame and configured to irradiate a beam on the wafer. The apparatus may further include a detector on an opposite side of the horizontal frame from the beam irradiator and configured to receive the beam after the beam has penetrated through the wafer and a calculator configured to measure the wafer by using the beam received by the detector.

According to an aspect of the present inventive concept, there is provided an apparatus for measuring a wafer. The apparatus may include a stage and a chuck disposed on the stage and comprising a plate connected with the stage, a horizontal frame configured to support a wafer and a vertical frame connecting the plate and the horizontal frame. The apparatus may further include a beam irradiator disposed between the plate and the horizontal frame and configured to irradiate a beam on the wafer and a detector disposed above the horizontal frame and configured to receive the beam after it has penetrated through the wafer. The apparatus may further include a calculator configured to: measure the wafer by using the beam received by the detector; obtain a first image of the wafer by using the beam received by the detector, the first image representing measurement characteristics of the wafer; create a second image of the wafer by performing image processing of the first image, and perform inpainting on the first image using the second image thereby creating a combined image.

BRIEF DESCRIPTION OF THE DRAWINGS

The above and other objects, features and advantages of the present disclosure will become more apparent to those of ordinary skill in the art by describing in detail exemplary embodiments thereof with reference to the accompanying drawings, in which:

FIG. 1 is a schematic perspective view illustrating a wafer measuring apparatus according to some exemplary embodiments;

FIG. 3 is a cross-sectional view taken on line A-A of FIG. 2;

FIG. 4 is a cross-sectional view taken on line B-B of FIG. 2;

FIG. 6 is a cross-sectional view taken on line C-C of FIG. 5;

FIG. 8 is a cross-sectional view provided to explain a wafer measuring apparatus according to some other exemplary embodiments;

DETAILED DESCRIPTION

Hereinbelow, a wafer measuring apparatus according to some exemplary embodiments will be described with reference to FIGS. 1 to 6.

Figure 2:
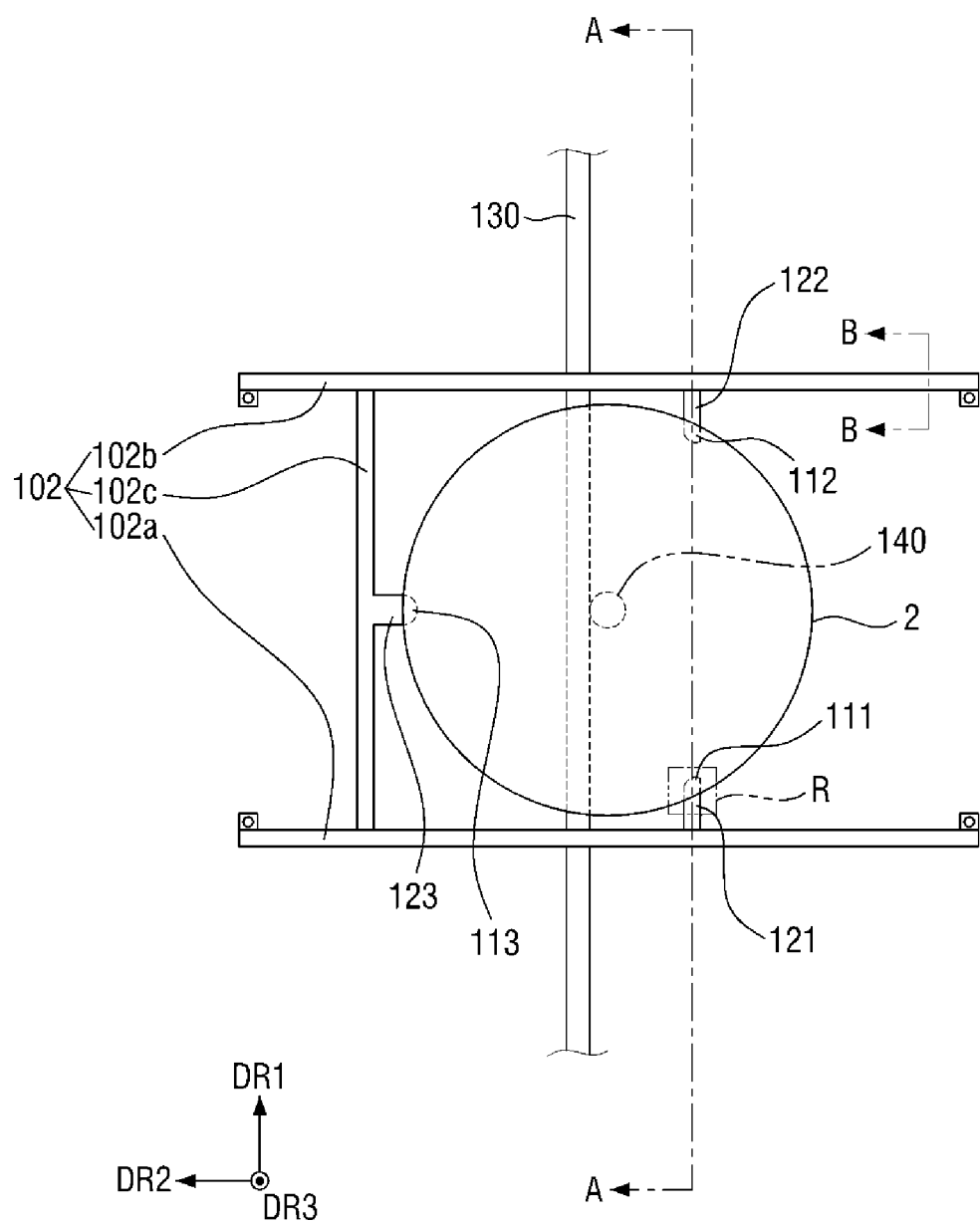
FIG. 2 is a schematic top view illustrating a wafer measuring apparatus according to some exemplary embodiments.
Figure 5:
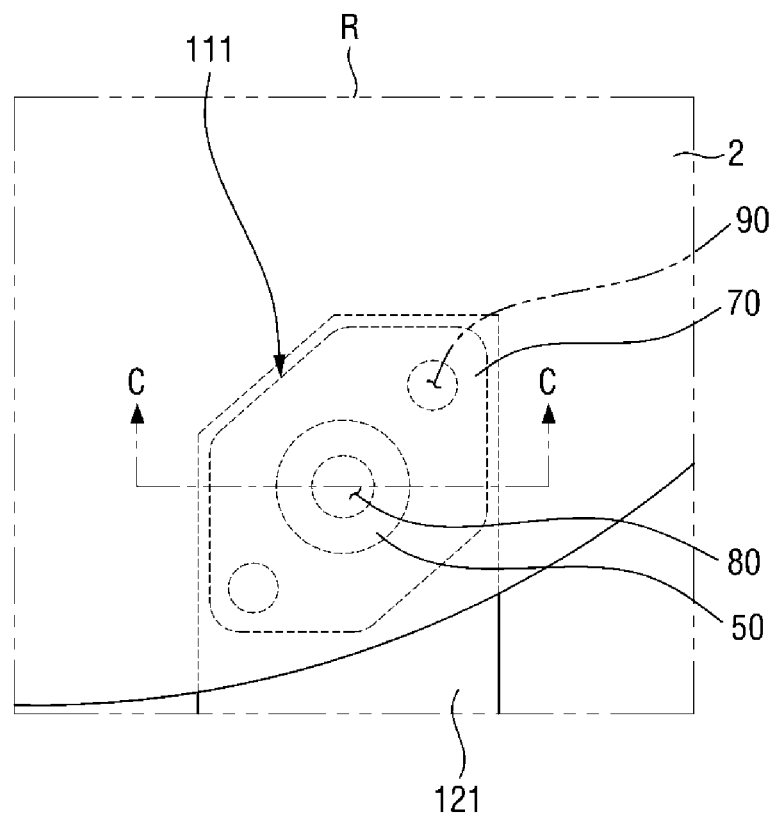
FIG. 5 is a view enlarging a region R of FIG. 2.

FIG. 1 is a schematic perspective view illustrating a wafer measuring apparatus according to some exemplary embodiments; FIG. 2 is a schematic top view illustrating a wafer measuring apparatus according to some exemplary embodiments; FIG. 3 is a cross-sectional view taken on line A-A of FIG. 2; FIG. 4 is a cross-sectional view taken on line B-B of FIG. 2; FIG. 5 is a view enlarging a region R of FIG. 2; FIG. 6 is a cross-sectional view taken on line C-C of FIG. 5.

Referring to FIGS. 1 to 6, the wafer measuring apparatus 1 according to some exemplary embodiments includes a main body 10, a stage 20, a first transport 30, a second transport 40, a chuck 100, first to third adsorption portions 111, 112, 113, a support bar 130 (also described as a support or supporting structure), a beam irradiator 140, a detector 150, and a calculator 160.

The main body 10 may constitute an external frame of the wafer measuring apparatus 1. Although FIG. 3 illustrates that the main body 10 completely wraps the wafer measuring apparatus 1, this is merely exemplary, and the technical concept of the present disclosure is not limited thereto.

The stage 20 may be disposed inside the main body 10. The stage 20 may be moved by the first transport 30 and the second transport 40. For example, a motor or actuator may cause the first transport 30 and second transport 40 to move forward and backward along respective directions. First transport 30 and second transport 40 may be a transport platform that can move stage 20 and/or with which stage 20 can move freely on top of First transport 30 and second transport 40 may each have an elongated plank shape.

The first transport 30 may be disposed on a lower portion of the stage 20. The first transport 30 may extend in a first direction DR1. The stage 20 may be moved, for example, along the first transport 30 or by the first transport 30 in the first direction DR1. For example, the first transport 30 may move the stage 20 in the first direction DR1.

The second transport 40 may be disposed on a lower portion of the stage 20. For example, the second transport 40 may be disposed on a lower portion of the first transport 30, although the technical concept of the present disclosure is not limited thereto.

The second transport 40 may be disposed to intersect the first transport 30 and/or be coupled to the first transport 30. For example, the second transport 40 may extend in a second direction DR2 which is orthogonal to the first direction DR1. The stage 20 may move in the second direction DR2, for example, along the second transport 40 or by the second transport 40. In this case, the first transport 30 connected with the stage 20 may move in the second direction DR2 along the second transport 40 or by the second transport 40. For example, the second transport 40 may move the stage 20 in the second direction DR2. In some example embodiments, the first transport 30 and second transport 40 may be slidably connected in such a way the first transport 30 may move independently in the first direction DR1 without affecting the movement of the second transport 40 and the first transport 30 and second transport 40 may both move synchronously in the second direction DR2 when the second transport 40 moves in the second direction DR2. The first transport 30 may be, for example, a conveyor, implemented for example by a conveyor belt, on which the platform 20 is secured. The second transport 40 may similarly be a conveyor, implemented for example by a conveyor belt, on which the first transport 30 is secured. One or both of the first transport 30 and second transport 40 may also or alternatively be movable by using rails connected to the end of the respective transport.

The chuck 100 may be disposed on the stage 20. The wafer 2 may be loaded on the chuck 100. The chuck 100 may include a plate 101, a horizontal frame 102, and a vertical frame 103.

The plate 101 may be connected with the stage 20 and be disposed on the stage 20. The plate 101 may have, for example, a planar form, but the technical concept of the present disclosure is not limited thereto.

The horizontal frame 102 may be disposed on the plate 101. The wafer 2 may be loaded on the horizontal frame 102. The horizontal frame 102 may include a first horizontal frame 102a (also described as a first horizontal frame portion), a second horizontal frame 102b (also described as a second horizontal frame portion), and a third horizontal frame 102c (also described as a third horizontal frame portion).

The first horizontal frame 102a may extend in the second direction DR2. The first horizontal frame 102a may include an inhalation line 85 disposed therewithin, as illustrated in FIG. 4. The inhalation line 85 may be disposed within the first horizontal frame 102a along the second direction DR2 where the first horizontal frame 102a extends.

The second horizontal frame 102b may be displaced from the first horizontal frame 102a in the first direction DR1. The second horizontal frame 102b may extend in the second direction DR2. The second horizontal frame 102b may include an inhalation line 85 disposed therewithin. The inhalation line 85 may be disposed within the second horizontal frame 102b along the second direction DR2 where the second horizontal frame 102b extends.

The third horizontal frame 102c may connect the first horizontal frame 102a and the second horizontal frame 102b. The third horizontal frame 102c may connect, for example, a side surface of the first horizontal frame 102a and the second horizontal frame 102b. The third horizontal frame 102c may extend, for example, in the first direction DR1.

The third horizontal frame 102c may include the inhalation line 85 disposed therewithin. The inhalation line 85 may be disposed within the third horizontal frame 102c along the first direction DR1 in which the third horizontal frame 102c extends. The inhalation line 85 disposed within the third horizontal frame 102c may be connected with the inhalation line 85 disposed within the first horizontal frame 102a and the inhalation line 85 disposed within the second horizontal frame 102b, respectively.

The horizontal frame 102 may have a H shape. For example, in the horizontal frame 102, based on the third horizontal frame 102c, a length of the horizontal frame in the second direction DR2 where the wafer 2 is loaded may be formed to be more than a combined length of the horizontal frame in the second direction DR2 where the wafer 2 is not loaded.

The horizontal frame 102 herein may include a first protrusion 121, a second protrusion 122, and a third protrusion 123.

The first protrusion 121 may be installed on the first horizontal frame 102a. The first protrusion 121 may protrude horizontally toward a position where the wafer 2 is loaded. The inhalation line 85 may be disposed within the first protrusion 121 along a direction where the first protrusion 121 extends. The inhalation line 85 disposed within the first protrusion 121 may be connected with the inhalation line 85 disposed within the first horizontal frame 102a.

The second protrusion 122 may be installed on the second horizontal frame 102b. The second protrusion 122 may protrude horizontally toward a position where the wafer 2 is loaded. The second protrusion 122 may be disposed to face the first protrusion 121. However, the technical concept of the present disclosure is not limited hereto.

The inhalation line 85 may be disposed within the second protrusion 122 along the direction where the second protrusion 122 extends. The inhalation line 85 disposed within the second protrusion 122 may be connected with the inhalation line 85 disposed within the second horizontal frame 102b.

The third protrusion 123 may be installed on the third horizontal frame 102c. The third protrusion 123 may protrude horizontally in a position where the wafer 2 is loaded. The inhalation line 85 may be disposed within the third protrusion 123 along a direction where the third protrusion 123 extends. The inhalation line 85 disposed within the third protrusion 123 may be connected with the inhalation line 85 disposed within the third horizontal frame 102c. Additionally, the inhalation line 85 may be connected to an air source (not illustrated), such as an air vacuum, air pump, or the like. The inhalation line 85 may also be described as a suction line.

The first adsorption portion 111 may be connected with the first horizontal frame 102a. Specifically, the first adsorption portion 111 may be connected with or at an end of the first protrusion 121 installed in the first horizontal frame 102a.

The first adsorption portion 111 may be a part which is in contact with the wafer 2 loaded on the chuck 100. The first adsorption portion 111 may adsorb a lower surface of the wafer 2 on the first adsorption portion 111 by inhaling the air. For example, adsorption portion 111 may adsorb a lower surface of the wafer 2 by suction forces due to the inhalation of air through inhalation line 85. The first adsorption portion 111 may be in contact only with a lower surface of the wafer 2, for example. However, the technical concept of the present disclosure is not limited hereto.

Referring to FIGS. 5 and 6, the first adsorption portion 111 may include a pad 50, a washer 60, a pad cover 70, an inhalation hole 80, and a bolt coupler 90.

The pad 50 may be disposed on an end of the first protrusion 121. The pad 50 may be a part which is in contact with a lower surface of the wafer 2.

The washer 60 may be disposed between the pad 50 and the first protrusion 121. For example, as illustrated in FIG. 6, the washer 60 may be disposed only on a partial region between the pad 50 and the first protrusion 121. However, the technical concept of the present disclosure is not limited hereto. For example, according to some other exemplary embodiments, the washer 60 may be disposed to completely overlap the pad 50 in a third direction DR3.

The washer 60 may include a material having elasticity. For example, the washer 60 may comprise at least one type of rubber material such as ethylene rubber, nitrile rubber, chloroprene rubber, silicon rubber, and fluorine rubber. However, the technical concept of the present disclosure is not limited hereto. For example, according to some other exemplary embodiments, the washer 60 may include another material other than rubber having elasticity, e.g., another elastomeric material.

The pad cover 70 may surround at least a portion of a sidewall of the pad 50. The bolt coupler 90 may be disposed so as to penetrate through the pad cover 70 in the third direction DR3. The pad cover 70 may be connected with the first protrusion 121 by using a bolt coupled to the bolt coupler 90. The pad 50 may be fixed on the first protrusion 121 by the pad cover 70.

The inhalation hole 80 may be disposed to penetrate through each of the pad 50 and the washer 60 in the third direction DR3. The inhalation hole 80 may extend to an inner portion of the first protrusion 121. The inhalation hole 80 may be connected with the inhalation line 85 disposed within the first protrusion 121.

The first adsorption portion 111 may adsorb a lower surface of the wafer 2 on the pad 50 by inhaling air through the inhalation hole 80, the inhalation line 85 disposed within the first protrusion 121, and the inhalation line 85 disposed within the first horizontal frame 102a.

The second adsorption portion 112 may be connected with the second horizontal frame 102b. Specifically, the second adsorption portion 112 may be connected with or at an end of the second protrusion 122 installed on the second horizontal frame 102b.

The second adsorption portion 112 may be a part which is in contact with the wafer 2 loaded on the chuck 100. The second adsorption portion 112 may adsorb a lower surface of the wafer 2 on the second adsorption portion 112 by inhaling air.

Structure of the second adsorption portion 112 may be the same as or similar to that of the first adsorption portion 111. Accordingly, specific explanation with respect to the second adsorption portion 112 will not be provided herein.

The third adsorption portion 113 may be connected with the third horizontal frame 102c. Specifically, the third adsorption portion 113 may be connected with or at an end of the third protrusion 123 installed on the third horizontal frame 102c.

The third adsorption portion 113 may be a part which is in contact with the wafer 2 loaded on the chuck 100. The third adsorption portion 113 may adsorb a lower surface of the wafer 2 on the third adsorption portion 113 by inhaling the air.

Structure of the third adsorption portion 113 may be the same as or similar to that of the first adsorption portion 111. Accordingly, specific explanation with respect to the third adsorption portion 113 will not be provided herein.

The wafer measuring apparatus according to some exemplary embodiments may load the wafer 2 on the chuck 100 by inhaling air in utilization of the first to third adsorption portions 111, 112, 113. For example, the wafer 2 may be retained in position on the chuck by suction forces due to the inhalation of air through respective inhalation holes of the first to third adsorption portions 111, 112, 113.

The support bar 130 may be disposed to penetrate through the chuck 100 in the first direction DR1. However, the technical concept of the present disclosure is not limited hereto. For example, according to some other exemplary embodiments, differently from the example illustrated in FIG. 2, the support bar 130 may be disposed to penetrate through the chuck 100 in the second direction DR2.

The support bar 130 may be disposed between the plate 101 and the horizontal frame 102. The support bar 130 may be displaced from each of the plate 101, the horizontal frame 102, and the vertical frame 103. Both ends of the support bar 130 may be connected and fixed to the main body 10.

The beam irradiator 140 may be disposed between the plate 101 and the horizontal frame 102. The beam irradiator 140 may be connected and fixed to the support bar 130.

The beam irradiator 140 may irradiate a beam L (see FIG. 3) on the wafer 2 loaded on the horizontal frame 102. The beam L irradiated from the beam irradiator 140 may penetrate through the wafer 2.

The detector 150 may be disposed above the horizontal frame 102, on an opposite side of the horizontal frame 102 from the beam irradiator 140. For example, the detector 150 may be disposed above the wafer 2, which is loaded on the horizontal frame 102. Although FIG. 3 illustrates that the detector 150 is connected with the main body 10, the technical concept of the present disclosure is not limited thereto. The detector 150 may receive the beam L, which has penetrated through the wafer 2, at an alternate location. For example, the detector 150 may be placed between the plate 101 and the horizontal frame 102 and the beam irradiator 140 may be on an opposite side of the horizontal frame 102 from the detector 150.

The calculator 160 is configured to measure the wafer 2 by using information with respect to the beam L received by the detector 150. The term "calculator" is meant to be used in its broadest sense to include one or more hardware components such as: controllers, computers, processors such as CPU (Central Processing Unit) and GPU (graphics processor), microprocessors, and/or other computer hardware, and/or software, and/or computer implemented algorithms that may be associated with the calculator 160 and/or the detector 150 which may cooperate in controlling various functions, image processing techniques, and outputs as explained below. For example, the calculator may be part of a processor, controller or control system. The method for measuring the wafer 2 by the calculator 160 will be specifically described below.

Although FIG. 3 illustrates that the calculator 160 is disposed on an external portion of the main body 10, this is only for convenience of explanation, and the technical concept of the present disclosure is not limited thereto.

Hereinbelow, a wafer measuring apparatus according to some other exemplary embodiments will be described with reference to FIG. 7. The difference from the wafer measuring apparatus illustrated in FIG. 2 will be highlighted.

Figure 7:
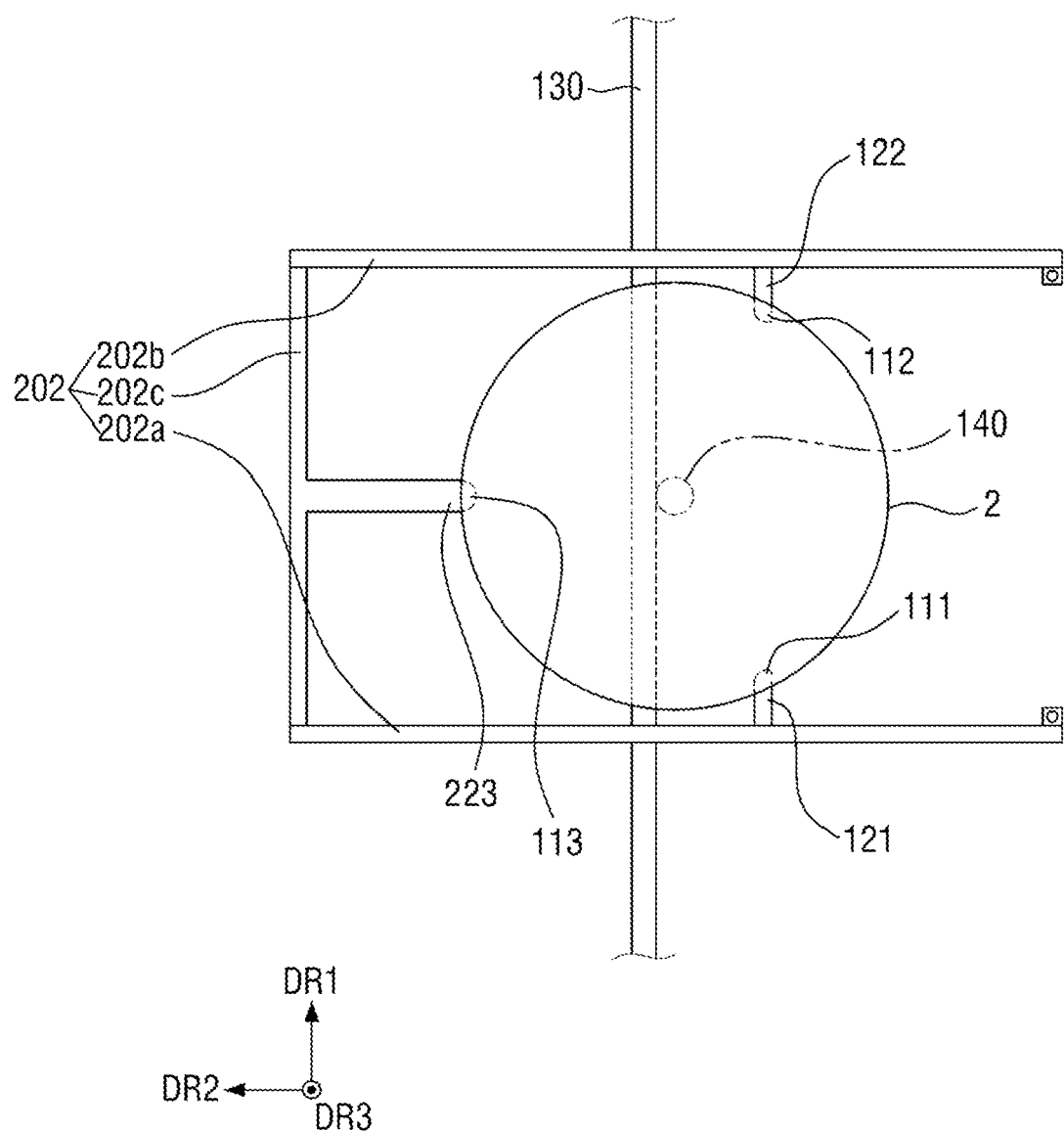
FIG. 7 is a schematic top view illustrating a wafer measuring apparatus according to some other exemplary embodiments.

FIG. 7 is a schematic top view illustrating a wafer measuring apparatus according to some other exemplary embodiments.

Referring to FIG. 7, in the wafer measuring apparatus according to some other exemplary embodiments, a planar shape of the horizontal frame 202 may have a "C" character form. For example, the third horizontal frame 202c may connect an end of the first horizontal frame 202a and an end of the second horizontal frame 202b.

The third protrusion 223 installed on the third horizontal frame 202c may be formed to be longer than the first protrusion 121 installed on the first horizontal frame 202a and the second protrusion 122 installed on the second horizontal frame 202b.

Hereinbelow, a wafer measuring apparatus according to some other exemplary embodiments will be described with reference to FIG. 8. The difference from the wafer measuring apparatus illustrated in FIG. 6 will be highlighted.

FIG. 8 is a cross-sectional view provided to explain a wafer measuring apparatus according to some other exemplary embodiments.

Referring to FIG. 8, the wafer measuring apparatus according to some other exemplary embodiments may be disposed so that the pad 55 is in contact with the first protrusion 121.

The pad 55 may include a material having elasticity. For example, the pad 55 may comprise at least one type of rubber material such as ethylene rubber, nitrile rubber, chloroprene rubber, silicon rubber, and fluorine rubber. However, the technical concept of the present disclosure is not limited hereto. For example, according to some other exemplary embodiments, the pad 55 may include another material other than the rubber having elasticity, e.g., another elastomeric material. Hereinbelow, a method for fabricating a semiconductor device according to some exemplary embodiments will be described with reference to FIGS. 1 and 3 and FIGS. 9 to 11.

Figure 9:
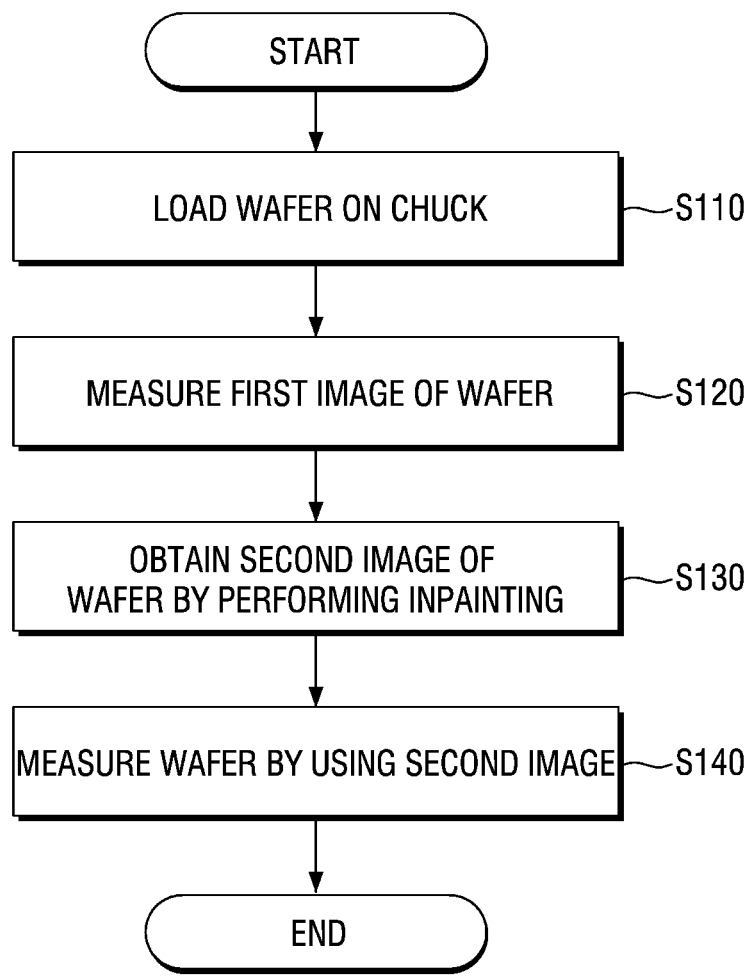
FIG. 9 is a flowchart provided to explain a method for fabricating a semiconductor device according to some exemplary embodiments.
Figure 10:
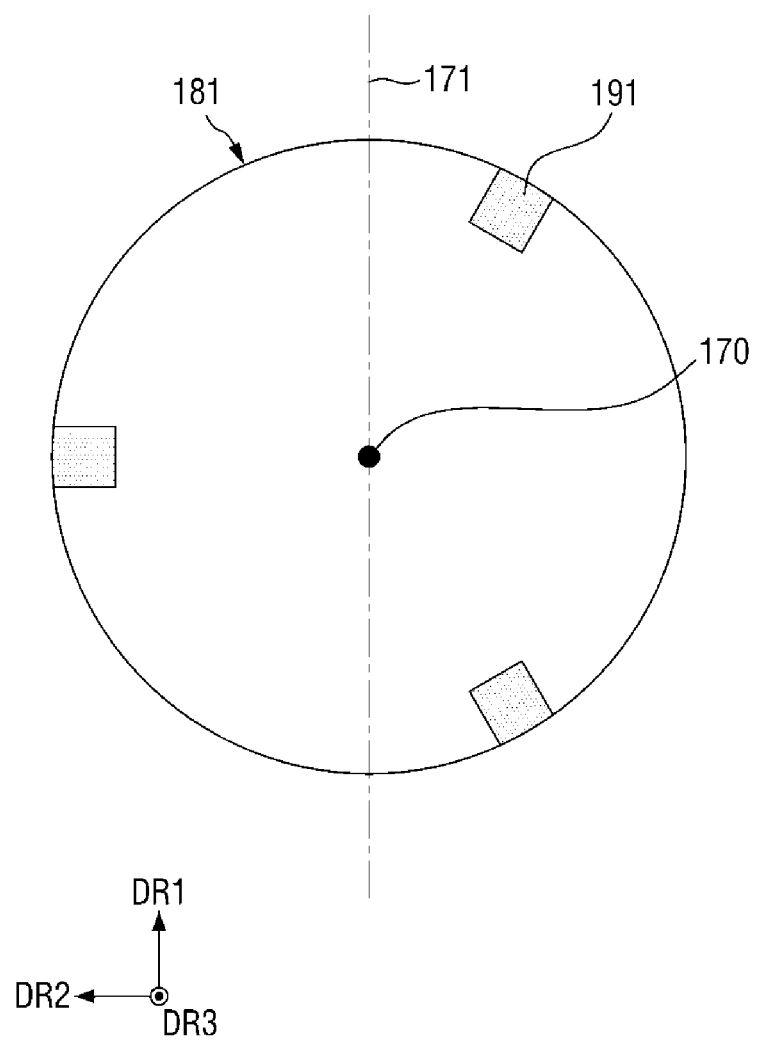
FIGS. 10 and 11 are views provided to explain images of a wafer obtained through a method for fabricating a semiconductor device according to some exemplary embodiments.
Figure 11:
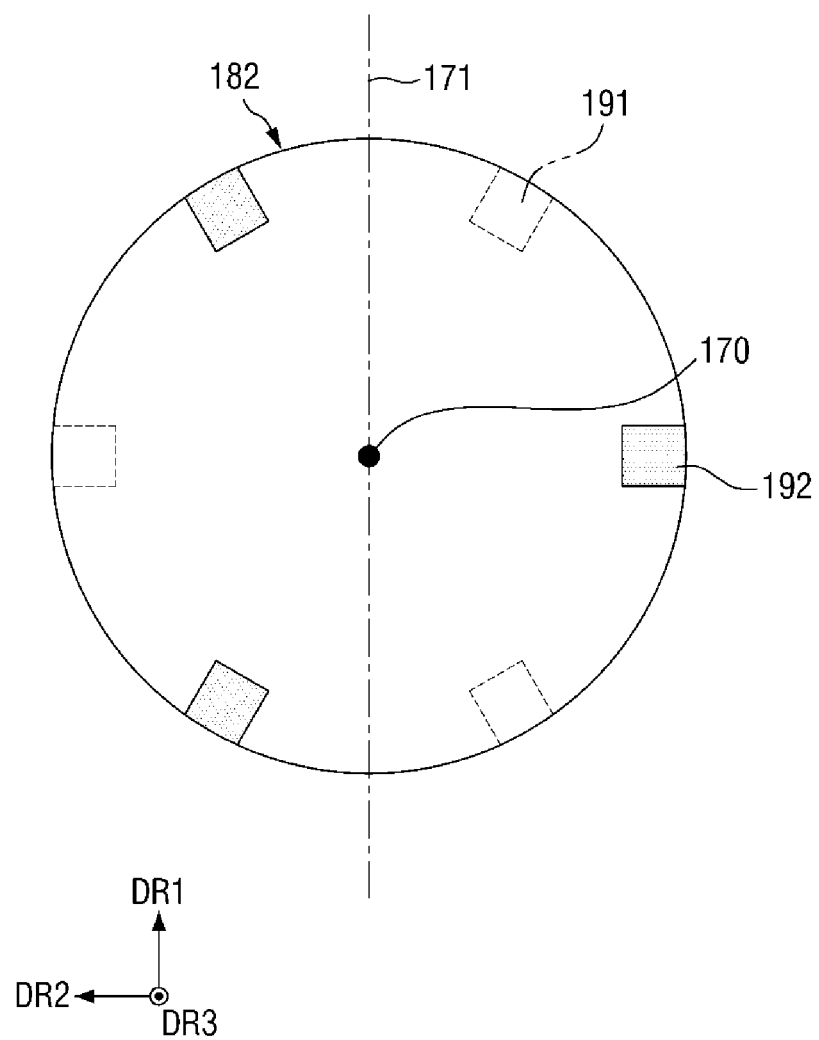

FIG. 9 is a flowchart provided to explain a method for fabricating a semiconductor device according to some exemplary embodiments; FIGS. 10 and 11 are views provided to explain images of a wafer obtained through a method for fabricating a semiconductor device according to some exemplary embodiments.

Referring to FIGS. 1 to 3 and 9, the wafer 2 is loaded on the chuck 100 at S110.

The wafer 2 may be adsorbed on each of the first to third adsorption portions 111, 112, 113 and loaded on the horizontal frame 102. Each of the first to third adsorption portions 111, 112, 113 may inhale the air and adsorb the wafer 2, e.g., by suction forces. Additionally, each of the first to third adsorption portions 111, 112, 113 may be equally spaced apart from one another, e.g., adsorption portions 111, 112, 113 may each be spaced apart from one another about 120° around the wafer 2.

Referring to FIGS. 1 to 3, 9 and 10, the calculator 160 measures a first image 181 of the wafer 2 at S120.

The beam L provided from the beam irradiator 140 may penetrate through the wafer 2 and may be received by the detector 150. The calculator 160 may measure the wafer 2 by using the beam L received by the detector 150. For example, the calculator 160 may measure the wafer 2 on the basis of signal information received by the detector 150 as a result of the beam L being irradiated onto the detector 150. The calculator 160 may measure the suitability characteristics of the wafer 2, e.g., the electrical, physical, and mechanical characteristics of the wafer 2 may be measured by a non-destructive inspection on the basis of signal information received by the detector 150.

As illustrated in FIG. 10, a first image 181 of the wafer 2 may include a first non-measured region 191 where the beam L does not penetrate through the wafer 2. The first non-measured region 191 may be due to the first to third adsorption portions 111, 112, 113, which are in contact with the wafer 2, not allowing the beam L to penetrate and/or distorting the beam L. For example, the first non-measured region 191 may correspond spatially to the location of the first to third adsorption portions 111, 112, 113.

Referring to FIGS. 1 to 3 and 9 to 11, the calculator 160 may obtain a second image 182 of the wafer 2 by performing inpainting with respect to the first image 181 of the wafer 2 at S130. Herein, inpainting indicates an image processing method which fills a region and restores the image when the input image contains a damaged and/or empty region. For example, inpainting may be a process in which lost, damaged, or deteriorated parts of an image are reconstructed. Additionally, lost, damaged, or deteriorated parts of an image may correspond to regions where adsorption portions 111, 112, 113 block and/or distort the transmission of beam L. Accordingly, in some example embodiments, those distorted regions may be inpainted with other non-distorted regions as explained below.

As illustrated in FIG. 11, the second image 182 of the wafer 2 may include a second non-measured region 192. For example, the second non-measured region 192 may correspond to the first non-measured region 191 where the beam L does not penetrate. For example, the second non-measured region 192 may be due to the first to third adsorption portions 111, 112, 113, which are in contact with the wafer 2, not allowing the beam L to penetrate and/or distorting the beam L in the first image 181. For example, the second image 182 may be a digitally reproduced version of the first image 181 where the position of each second non-measured region 192 corresponds to the extent of virtual rotation of the wafer (e.g., the extent of digital rotation of the first non-measured region 191). According to some exemplary embodiments, obtainment of the second image 182 of the wafer 2 may include processing the first image 181 by rotating the first image 181 in a center-symmetric manner (e.g., around a center point, or central axis) based on a center 170 (e.g., center point or central axis) of the first image 180.

According to some other exemplary embodiments, obtainment of the second image 182 of the wafer 2 may include processing the first image 181 by flipping the first image 181 in an axis-symmetric manner (e.g., around a linear axis) based on a line 171 passing through the center 170 of the first image 181.

According to some other exemplary embodiments, obtainment of the second image 182 of the wafer 2 may include combining a third image obtained by rotating the first image 181 in a center-symmetric manner based on the center 170 of the first image 181 and a fourth image obtained by forming the first image 181 in an axis-symmetric manner based on the line 171 passing through the center 170 of the first image 181.

According to some embodiments, the first image 181 is an actual measured image of the wafer 2 obtained at the detector 150 on the basis of the beam L being irradiated through the wafer 2 and onto the detector 150. The calculator 160 may be configured to receive the measured image of the wafer 2 (first image 181) obtained at the detector 150. Next, a second image 182 may be constructed by calculator 160 according to various image processing techniques disclosed herein. In this example embodiment, the second image 182 is a virtual image (non-measured image) constructed by calculator 160 on the basis of the first image 181; and the second image 182 may be constructed by any of the following processes: (a) rotation of the first image 181 about center 170 to be center-symmetric, (b) flipping the first image 181 along axis 171 to be axis symmetric (c) an averaged combination of process (a) and process (b). The second image 182 may therefore be a combined image derived from a third image and fourth image. In these exemplary embodiments, the second image is used by the calculator 160 to assess the attributes and suitability of wafer 2, e.g., the physical, mechanical, and electrical attributes of wafer 2.

At S140, the calculator 160 measures the wafer 2 by using the second image 182 of the wafer 2.

Specifically, the calculator 160 may measure the wafer 2 by combining the first image 181 of the wafer 2 which is measured by using the beam L penetrating through the wafer 2 and the second image 182 of the wafer 2 obtained by manipulating (e.g., rotating and/or flipping) the first image 181.

The first non-measured region 191 included in the first image 181 may be restored by using the second image 182. Further, the second non-measured region 192 included in the second image 182 may be restored by using the first image 181. For example, the first image 181 and second image 182 may be superimposed on each other and missing portions from the first image 181 due to the first to third adsorption portions 111, 112, and 113 may be replaced with the portions of the second image 182 superimposed over those missing portions.

Wafer measurement in utilization of the inpainting method may be used in examining a general state of the wafer (e.g., thickness or resistance of the wafer).

Hereinbelow, a method for fabricating a semiconductor device according to some other exemplary embodiments will be described with reference to FIGS. 1 to 3, 10, 12 and 13.

Figure 12:
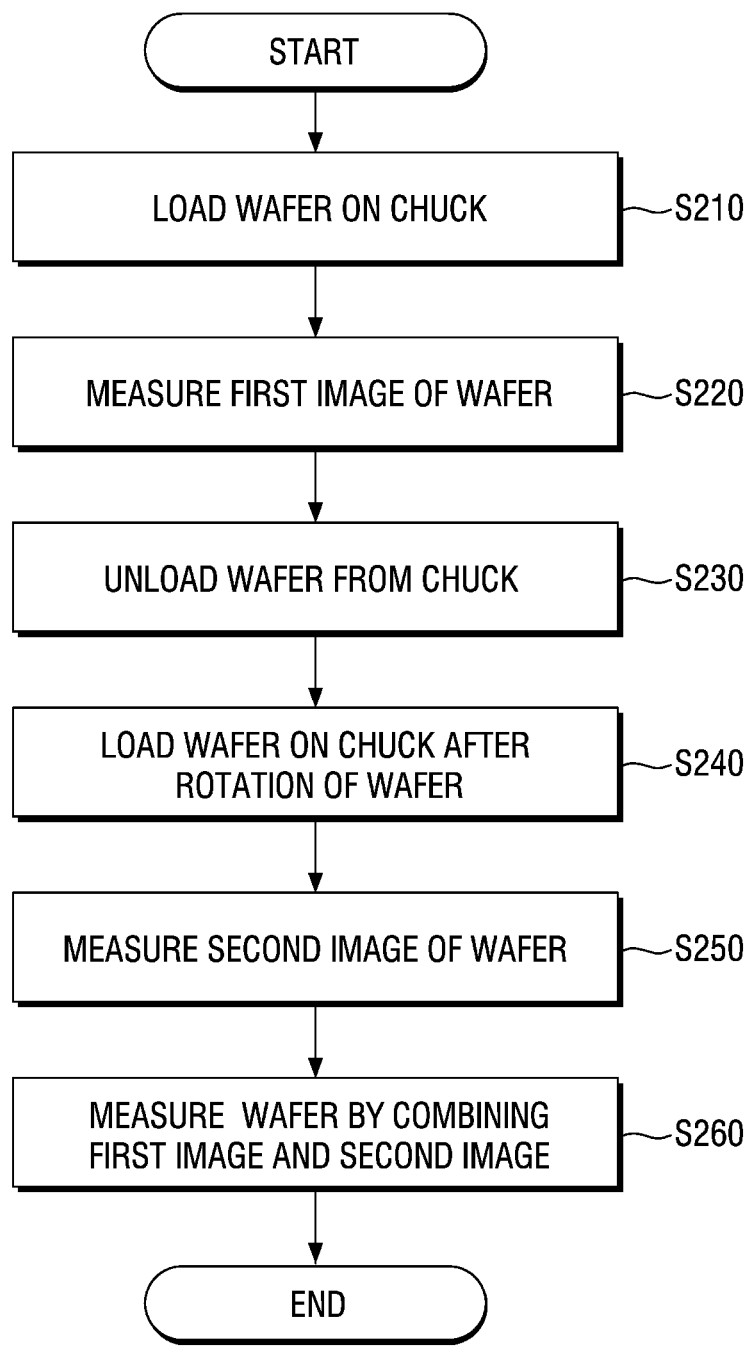
FIG. 12 is a flowchart provided to explain a method for fabricating a semiconductor device according to some other exemplary embodiments.
Figure 13:
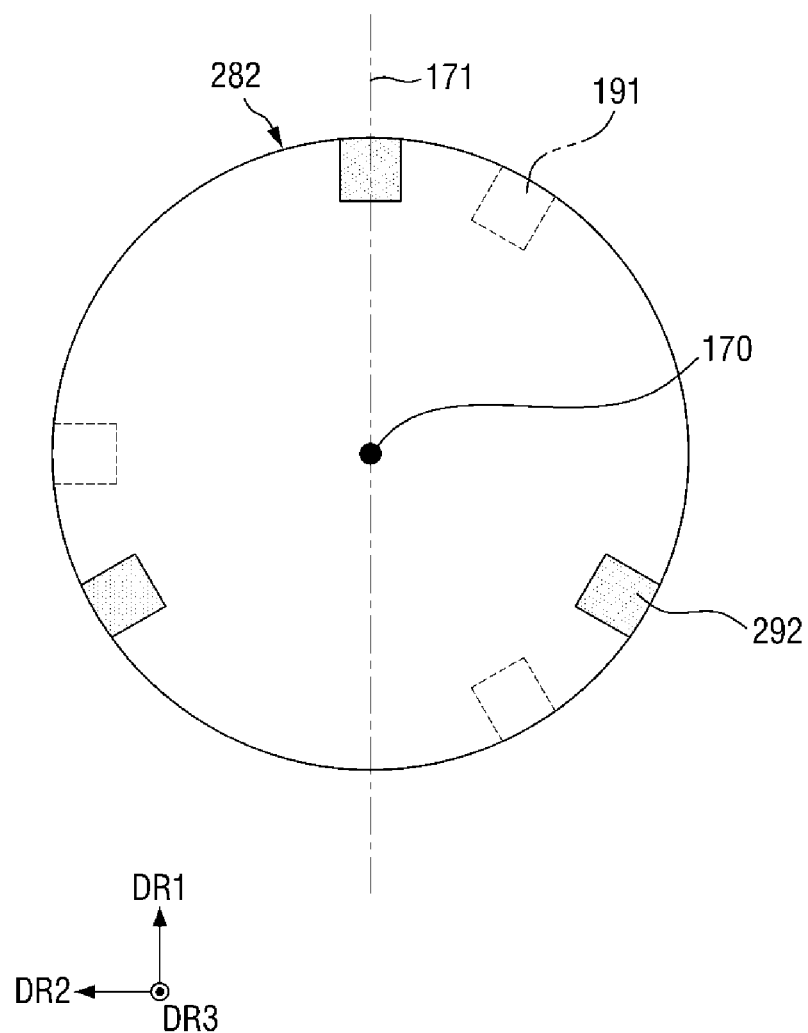
FIG. 13 is a view provided to explain images of a wafer obtained through a method for fabricating a semiconductor device according to some other exemplary embodiments.

FIG. 12 is a flowchart provided to explain a method for fabricating a semiconductor device according to some other exemplary embodiments; and FIG. 13 is a view provided to explain images of a wafer obtained through a method for fabricating a semiconductor device according to some other exemplary embodiments.

Referring to FIGS. 1 to 3 and 12, the wafer 2 may be loaded on the chuck 100 at S210.

The wafer 2 may be adsorbed on each of the first to third adsorption portions 111, 112, 113 and loaded on the horizontal frame 102. Each of the first to third adsorption portions 111, 112, 113 may inhale air and adsorb the wafer 2, for example by suction forces.

Referring to FIGS. 1 to 3, 10 and 12, the calculator 160 may measure the first image 181 of the wafer 2 at S220.

The beam L provided from the beam irradiator 140 may penetrate through the wafer 2 and may be received by the detector 150. The calculator 160 may measure the wafer 2 by using the beam L received by the detector 150. For example, the calculator 160 may measure the wafer 2 on the basis of signal information received by the detector 150 as a result of the beam L being irradiated onto the detector 150.

As illustrated in FIG. 10, the first image 181 of the wafer 2 may include a first non-measured region 191 where the beam L does not penetrate. The first non-measured region 191 may be generated by the first to third adsorption portions 111, 112, 113 which are in contact with the wafer 2.

Referring to FIGS. 1 to 3 and 12, the first image 181 of the wafer 2 may be measured, and the wafer 2 may be unloaded from the chuck at S230.

At S240, the wafer 2 may rotate, and then the rotated wafer 2 may be loaded on the chuck 100.

Referring to FIGS. 1 to 3, 12 and 13, the calculator 160 may measure the second image 282 of the wafer 2 at S250.

The second image 282 of the wafer 2 may be measured with the same or similar method as the method for measuring the first image 181.

As illustrated in FIG. 13, the second image 282 of the wafer 2 may include the second non-measured region 292 where the beam L does not penetrate. The second non-measured region 292 may be generated by the first to third adsorption portions 111, 112, 113 which are in contact with the wafer 2.

At S260, the calculator 160 may measure the wafer 2 by combining the first image 181 of the wafer 2 and the second image 282 of the wafer 2.

Specifically, the calculator 160 may measure the wafer 2 by combining the first image 181 (which is measured before rotation of the wafer 2) and the second image 282 (which is measured after rotation of the wafer 2).

Wafer measurement in utilization of rotation of the wafer 2 may be used in performing precise examination of the wafer (e.g., defect examination). For example, a precise examination of the wafer may be performed by utilizing the above disclosed rotation methods of wafer 2. Such examination may be non-destructive and examine the suitability of the wafer 2. Suitability of the wafer 2 may be based on: defects in the internal portions of wafer 2, surface defects such as bending, scratches, or the like, electrical characteristics, and other physical characteristics that affect the performance and reliability of semiconductor devices.

The wafer examination apparatus and the method for fabricating the semiconductor device in utilization of the wafer examination apparatus according to some exemplary embodiments may enhance reliability with respect to a beam transmission method of the wafer measuring method by using a chuck which minimizes interference of the beam.

Further, the wafer examination apparatus and the method for fabricating the semiconductor device in utilization of the wafer examination apparatus according to some exemplary embodiments may enhance reliability of the wafer measuring method by measuring the wafer in utilization of the inpainting method and/or rotation method of the wafer.

Exemplary embodiments according to the technical concept of the present disclosure were explained hereinabove with reference to the drawings attached, but it should be understood that the present disclosure is not limited to the aforementioned exemplary embodiments, but may be fabricated in various different forms, and may be implemented by a person skilled in the art in other specific forms without altering the technical concept or essential characteristics of the present disclosure. Accordingly, it will be understood that the exemplary embodiments described above are only illustrative, and should not be construed as limiting.

What is claimed is:

1. An apparatus for measuring a wafer, comprising:
a stage;
a chuck disposed on the stage and comprising a plate connected with the stage, a horizontal frame configured to support a wafer, and a vertical frame connecting the plate and the horizontal frame;
first to third adsorption portions connected with the horizontal frame and configured to adsorb the wafer;
a support bar penetrating through the chuck and extending in a first direction;
a beam irradiator connected to the support bar and disposed between the plate and the horizontal frame, the beam irradiator being configured to irradiate a beam on the wafer; and
a detector on an opposite side of the horizontal frame from the beam irradiator and configured to receive the beam after it has penetrated through the wafer.

2. The apparatus of claim 1, further comprising a calculator configured to measure the wafer by using the beam received by the detector.

3. The apparatus of claim 2, wherein the calculator is configured to:
obtain a first image of the wafer in a first state of the wafer, the first image representing measurement characteristics of the wafer,
obtain a second image of the wafer in a second state, the second image representing measurement characteristics of the wafer and wherein the second state is a rotated state with respect to the first state,
combine the first image and the second image.

4. The apparatus of claim 2, wherein the calculator is configured to:
obtain a first image of the wafer by using the beam received by the detector;
create a second image of the wafer by performing image processing of the first image, and
perform inpainting on the first image using the second image, thereby creating a combined image.

5. The apparatus of claim 1, wherein the horizontal frame comprises:
a first horizontal frame portion extending in a second direction orthogonal to the first direction,
a second horizontal frame portion displaced from the first horizontal frame in the first direction and extending in the second direction, and
a third horizontal frame portion connecting the first horizontal frame portion and the second horizontal frame portion.

6. The apparatus of claim 5, wherein the horizontal frame comprises:
a first protrusion installed on the first horizontal frame portion, the first protrusion protruding toward the wafer and connected with the first adsorption portion,
a second protrusion installed on the second horizontal frame portion, the second protrusion protruding toward the wafer and connected with the second adsorption portion, and
a third protrusion installed on the third horizontal frame portion, the third protrusion protruding toward the wafer and connected with the third adsorption portion.

7. The apparatus of claim 5, wherein the third horizontal frame portion connects an end of the first horizontal frame portion and an end of the second horizontal frame portion.

8. The apparatus of claim 1, wherein the first adsorption portion comprises:
a pad in contact with the wafer and comprising an inhalation hole,
a washer disposed between the horizontal frame and the pad and having elasticity, and
a pad cover surrounding at least a portion of a sidewall of the pad and being connected with the horizontal frame.

9. The apparatus of claim 1, further comprising:
a first transport configured to move the stage in the first direction, and
a second transport configured to move the stage in a second direction orthogonal to the first direction.

10. The apparatus of claim 1, wherein each of the first to third adsorption portions is configured to adsorb the wafer by inhaling air through an inhalation hole thereby applying a suction force to the wafer.

11. The apparatus of claim 1, wherein the horizontal frame comprises an inhalation line disposed therewithin along a direction in which the horizontal frame extends.

12. The apparatus of claim 1, wherein the horizontal frame has an H shape.

13. An apparatus for measuring a wafer, comprising:
a stage;
a plate disposed on the stage;
a horizontal frame comprising a first horizontal frame portion extending in a first direction, a second horizontal frame portion displaced from the first horizontal frame portion in a second direction orthogonal to the first direction and extending in the first direction, and a third horizontal frame portion connecting the first horizontal frame portion and the second horizontal frame portion, wherein the horizontal frame is configured to support a wafer;
a vertical frame connecting the plate and the horizontal frame;
a first adsorption portion connected with the first horizontal frame portion and configured to adsorb the wafer;
a second adsorption portion connected with the second horizontal frame portion and configured to adsorb the wafer;
a third adsorption portion connected with the third horizontal frame portion and configured to adsorb the wafer;
a beam irradiator disposed between the plate and the horizontal frame and configured to irradiate a beam on the wafer;
a detector on an opposite side of the horizontal frame from the beam irradiator and configured to receive the beam after the beam has penetrated through the wafer; and
a calculator configured to measure the wafer by using the beam received by the detector.

14. The apparatus of claim 13, wherein the first adsorption portion comprises:
a pad in contact with the wafer and comprising an inhalation hole,
a washer disposed between the horizontal frame and the pad and having elasticity, and
a pad cover surrounding at least a portion of a sidewall of the pad and connected with the horizontal frame.

15. The apparatus of claim 13, wherein the horizontal frame comprises:
a first protrusion installed on the first horizontal frame portion, the first protrusion protruding toward the wafer and connected with the first adsorption portion,
a second protrusion installed on the second horizontal frame portion, the second protrusion protruding toward the wafer and connected with the second adsorption portion, and
a third protrusion installed on the third horizontal frame portion, the third protrusion protruding toward the wafer and connected with the third adsorption portion.

16. The apparatus of claim 13, wherein each of the first to third adsorption portions is configured to adsorb the wafer by inhaling air through an inhalation hole thereby applying a suction force to the wafer.

17. An apparatus for measuring a wafer, comprising:
a stage;
a chuck disposed on the stage and comprising a plate connected with the stage, a horizontal frame configured to support a wafer, and a vertical frame connecting the plate and the horizontal frame;
a beam irradiator disposed between the plate and the horizontal frame and configured to irradiate a beam on the wafer;
a detector disposed above the horizontal frame and configured to receive the beam after it has penetrated through the wafer; and
a calculator configured to: measure the wafer by using the beam received by the detector; obtain a first image of the wafer by using the beam received by the detector, the first image representing measurement characteristics of the wafer; create a second image of the wafer by performing image processing of the first image, and perform inpainting on the first image using the second image thereby creating a combined image.

18. The apparatus of claim 17, wherein the calculator is configured to create the second image by utilizing a center-symmetric image process based on a center of the first image.

19. The apparatus of claim 17, wherein the calculator is configured to create the second image by utilizing an axis-symmetric image process based on a line passing through a center of the first image.

20. The apparatus of claim 17, wherein the calculator is configured to: create a third image of the wafer by performing image processing of the first image by utilizing a center-symmetric image process based on a center of the first image, create a fourth image of the wafer by performing image processing of the first image by utilizing an axis-symmetric image process based on a line passing through the center of the first image, and calculate the second image by combining the third image and the fourth image.

* * * * *